United States Patent [19]

Hoeberechts et al.

[11] Patent Number: 4,469,945
[45] Date of Patent: Sep. 4, 1984

[54] DEVICE FOR DETECTING RADIATION AND SEMICONDUCTOR DEVICE FOR USE IN SUCH A DEVICE

[75] Inventors: Arthur M. E. Hoeberechts; Gerard E. van Rosmalen, both of Eindhoven, Netherlands

[73] Assignee: U.S. Philips Corporation, New York, N.Y.

[21] Appl. No.: 358,542

[22] Filed: Mar. 15, 1982

[30] Foreign Application Priority Data

Jul. 10, 1981 [NL] Netherlands ............. 8103304

[51] Int. Cl.³ .................. G01T 1/29; H01L 27/14
[52] U.S. Cl. ................... 250/370; 250/354.1
[58] Field of Search ............ 250/370, 371, 372, 354.1

[56] References Cited

U.S. PATENT DOCUMENTS 4,228,354  10/1980  Lehto et al. ............. 250/371
4,360,732  11/1982  Chapman et al. ......... 250/332

OTHER PUBLICATIONS

A. J. Steckl, R. D. Nelson, B. T. French, R. A. Gudmundsen, D. Schechter, "Application of Charge-Coupled Devices to Infrared Detection and Imaging", Proceedings of the IEEE, vol. 63, No. 1, (Jan. 1975), pp. 67–74, esp. 70–71.

Primary Examiner—Janice A. Howell
Assistant Examiner—Constantine Hannaher
Attorney, Agent, or Firm—Robert T. Mayer; Steven R. Biren

[57] ABSTRACT

In a radiation-sensitive semiconductor element which is divided into a number of sub-elements, the surface potential in the sub-elements varies with incident radiation as a result of charge carriers generated by the radiation. As soon as an adjustable threshold value of this potential is reached in one or more of the sub-elements, a current starts to flow which is signalled by means of a detector and a detection unit. Because the speed of reaching the threshold value depends on the intensity of the radiation, the time measured between the adjustment of the threshold value and the signalling of the current is a measure of the radiation intensity. By means of such a semiconductor element, the associated detection unit and extra electronics, if any, the energy or the cross-section of a beam can be determined and be readjusted, if necessary. Such a semiconductor device can also be used very readily for focusing, for example in VLP apparatus.

24 Claims, 19 Drawing Figures

DEVICE FOR DETECTING RADIATION AND SEMICONDUCTOR DEVICE FOR USE IN SUCH A DEVICE

BACKGROUND OF THE INVENTION

The invention relates to a device for detecting radiation comprising a semiconductor device having a semiconductor body with at least one radiation-sensitive element at its surface which can be exposed to radiation to be detected, said radiation-sensitive element comprising sub-elements for converting radiation to be detected into generated charge.

Such a device is described in non-prepublished Netherlands Patent Application No. 8003906. In this connection, radiation may be considered to be light, ultraviolet radiation or infrared radiation and, for example, X-ray radiation or electron radiation.

A device of the kind mentioned above may be used for controlling the diameter of the radiation energy of a radiation beam, or for focusing such a beam.

In this case the beam to be adjusted may originate from a scene to be displayed, for example, in a camera; the adjusting plane in this case usually is a plane in the camera where a photosensitive plate may be present. The beam may also be a reading beam or a writing beam for use in display apparatus and pick-up apparatus, respectively, of video disks, audio disks or disks in behalf of information storage (VLP, compact disk and DOR, respectively), in which the adjusting plane is formed by a plane at the area of the video or audio disk and the information carrier respectively.

The invention also relates to a semiconductor device suitable for use in a device as mentioned above.

The above-mentioned Netherlands Patent Application shows inter alia a radiation-sensitive semiconductor device for spectroscopic applications having a number of juxtaposed sub-elements each connected to an external voltage source via an individual resistor. When as a result of incident radiation a photoelectric current is generated in one of the sub-elements, the voltage drop as a result of said currents causes a signal across the associated resistor. The place of the incident radiation can be determined by means of this signal. The value of the output signal is a measure of the quantity of charge generated in the associated sub-element and hence of the energy of the radiation incident on said sub-element. The device shown is directed to detecting incident radiation on a sub-element by means of the instantaneous photoelectric current. Such a device is not suitable for determining, for example, the radiation energy or the diameter of a beam.

The above-mentioned Patent Application moreover describes a picture display device having a radiation-sensitive semiconductor device for beam positioning and track following. The semiconductor device comprises inter alia a so-called quadrant diode, a photosensitive diode constructed from four sub-diodes. When such a quadrant diode is used in a device for beam focusing, for example, the device shown in German Offenlegungsschrift No. 25 01 124 which uses an astigmatic beam, a very accurate positioning of the incident beam with respect to the center of the quadrant diode is necessary. In addition, extra optical auxiliary means are often necessary for such methods; in the above example, for example, a cylinder lens is used to obtain an astigmatic beam.

SUMMARY OF THE INVENTION

It is an object of the invention to provide a device for detecting radiation in which several sub-elements can be hit by incident radiation without circuitry means being necessary for adjusting the energy of a radiation beam or of the surface hit by a radiation beam, such as for example, the addition of generated output signals or the use of differential amplifiers.

Another object of the invention is to provide a device which can control the diameter or the radiation energy of a radiation beam or the combination of the two.

A further object of the invention is to provide a device for focusing radiation beams in which the positioning of the radiation-sensitive element relative to the beam is considerably less critical than in known devices. Yet a further object is to provide such a device in which the shape of the cross-section of the radiation beam does not influence the operation of the device and hence is very suitable for focusing an astigmatic beam.

The invention is based inter alia on the recognition of the fact that this can be achieved by storing the charge generated by incident radiation in the sub-elements, instead of by measuring the instantaneous photoelectric current as a result of charge carriers generated by incident radiation.

It is furthermore based on the recognition of the fact that this can be achieved by providing the sub-elements with charge reservoirs in which the charge generated by incident radiation can be stored and that the speed at which such a reservoir is filled with charge depends on the energy of the incident radiation.

In addition it is based on the recognition of the fact that this speed can be measured by measuring the time in which the charge generated by incident radiation has increased by an amount to be adjusted.

For that purpose, a device according to the invention is characterized in that the sub-elements are suitable for storing the generated charge and are each connected, via a current path comprising a barrier, to a detector which is common at least to a number of sub-elements, as a result of which the common detector receives a signal when the stored amount of generated charge in one or more of the sub-elements exceeds a threshold dependent on the barrier.

After the signal in such a device has been received by the detector, a detection unit may react to a detection signal given by the detector by removing the barrier. As a result of this, the charge stored in the sub-elements can be removed via the current path to an auxiliary circuit which is common to the sub-elements. The current caused by the amount of charge to be removed is partly a measure of the generated charge and hence of the amount of radiation. This current can also be measured by providing a second current path which is common to the sub-elements and which is also controlled by a detection unit which reacts to a signal of the detector.

When the charge has been removed from the sub-elements, the barrier can be provided again in the current path. When radiation impinges on the radiation-sensitive element, the amount of charge generated in one or more of the sub-elements as a result of radiation will be so large after a certain period of time that this exceeds the threshold dependent on the barrier. As a result of this the detector receives a signal after which the barrier can be removed again by means of the detection unit. After the charge has been removed from the sub-elements, the above-described cycle may be carried out again.

When the radiation is uniform, that is to say, the radiation energy and the cross-section of the beam substantially do not vary in time, the time difference between providing the barrier and receiving the signal by the detector will be substantially constant. However, as soon as the energy or the cross-section of the beam varies, one or more of the sub-elements will receive more or less radiation per unit of time. The associated amount of charge generated as a result of incident radiation will therefore exceed the threshold more or less rapidly, so that the signal to the detector is also given off more or less rapidly. This provides the possibility of readjusting one or both quantities in such manner that the time difference is again substantially constant.

In a device for focusing a beam, for example, an auxiliary beam derived from said beam is divided into two converging beams which are directed on an adjusting plane and on an auxiliary adjusting plane, respectively. Semiconductor devices having radiation-sensitive elements as described above are present, for example, at equal distances in front of the adjusting plane and behind the auxiliary adjusting plane, respectively. If the auxiliary beam is divided into two equal beams, the amount of radiation per unit of area will be substantially the same for both radiation-sensitive elements when the adjustment is correct. The detectors of the two devices will consequently receive a signal substantially simultaneously and will give off a detection signal to a control unit as a result of said signal.

When the adjustment is incorrect, to the contrary, the same amount of radiation will be incident on a smaller area in one of the two detectors. As a result of this the amount of generated charge exceeds the threshold adjusted by the barrier sooner so that the associated detector gives off a signal to the detection unit. A signal given off by the detection unit can be applied to a control unit to readjust, for example, the position of the objective with which the beam is focused.

An advantage of this device is that the radiation beam need not necessarily be incident on the center of the detector. This means that the location of the detector relative to the beam is not critical; it is sufficient if only a part of the incident radiation impinges on at least a part of the radiation-sensitive element.

A control signal for decreasing and increasing, respectively, the barrier can be derived from the detection signal by means of circuitry measures in such manner that said control signal appears as a reaction to the provided signal and removes the barrier. After a certain lapse of time said control signal falls and the barrier is provided again. This lapse of time may be chosen to be such, for example by means of a delay circuit, that substantially all charge generated as a result of incident radiation can be removed from the sub-elements. The duration between the falling of the control signal and the reappearance of said signal as a reaction to a detection signal can simply be measured, for example, by means of digital techniques; this duration is directly related to the amount of generated charge and hence to the incident radiation.

The said circuit elements for generating the control signal, as well as the detector, may be realized as an integrated circuit in the same semiconductor body in which the radiation-sensitive element is present.

The device according to the invention preferably comprises a detection unit which can provide a first signal to bring the elements in a suitable initial position for storing charge generated as a result of incident radiation and which can provide a detection signal originating from the detector or a signal derived therefrom to a control unit, which control unit can readjust, via an adjusting unit, the quantity to be controlled in such manner that the time difference between the first signal and the detection signal is substantially constant.

An advantage of such a device is that the signal processing and the readjustment can take place electronically, for example, by converting time measurements into frequency measurements.

In a device as mentioned above for adjusting a radiation beam, an auxiliary beam derived from the radiation beam can be divided into two converging beams each impinging via an optical system on a semiconductor body having at its surface at least a radiation-sensitive element, in which, viewed in the direction of the radiation, the surface of the semiconductor body having a first radiation-sensitive element is present before the focus of one converging beam and the surface of the other semiconductor body having a second radiation-sensitive element is present behind the focus of the other converging beam.

A preferred embodiment of such a device is characterized in that the two beams can impinge upon one semiconductor body which at its surface has at least two radiation-sensitive semiconductor elements, in which, viewed in the direction of the radiation, the surface of the semiconductor body at the area of the first radiation-sensitive semiconductor element is present before the focus of the first radiation beam, while the semiconductor body at the area of the second radiation-sensitive semiconductor element is covered with a layer of radiation-passing material having a refractive index exceeding that of the medium in which the semiconductor body is present and having such a thickness that the focus of the other beam is present in said layer as a result of the stronger convergence in said radiation-passing material.

Such a construction presents advantages in those devices in which the first and the second beam can be displayed, for example by optical auxiliary means, beside each other on one and the same plane. A first advantage is that the two radiation-sensitive elements (and, if desired, the detectors and other circuit elements) are provided in and on one semiconductor body. Since the two radiation-sensitive elements are present beside each other in the same semiconductor body, the difference, if any, in radiation sensitivity is extremely small. Moreover, the measure has a space-saving effect in that a semiconductor device need now be provided only in one plane.

Another embodiment of the device for adjusting an astigmatic beam is characterized in that the semiconductor device comprises at its surface at least one pair of radiation-sensitive semiconductor elements having parallel strip-shaped sub-elements in which the sub-elements of the two radiation-sensitive elements are provided at an angle relative to each other within one surface area. The sub-elements of the two radiation-sensitive elements are preferably transverse to each other.

The above-mentioned advantages of adjustment by means of radiation-sensitive elements provided in one and the same semiconductor body apply in this case also without it being necessary for the radiation beam to be adjusted accurately to the center of the radiation-sensitive element.

The barriers in the current paths can be controlled by means of a common base connection of a number of bipolar transistors which are present in the current paths and the emitters of which are each connected to a sub-element and the collectors of which are connected to the detector. However, the semiconductor device is preferably constructed with field effect transistors. A preferred embodiment of such a device is characterized in that the semiconductor body comprises a surface region of a first conductivity type having a number of first surface zones of a second conductivity type opposite to the first which form the sub-elements of the radiation-sensitive elements and the source zones of the field effect transistors, and at least one second surface zone which forms a common drain zone of the field effect transistors, the surface between the first surface zones and the second surface zone being covered with a layer of insulating material on which a gate electrode which is common to the field effect transistors is present.

BRIEF DESCRIPTION OF THE DRAWING

The invention will now be described in greater detail, with reference to several examples and the diagrammatic drawing, in which:

FIG. 3 is a diagrammatic plan view of an embodiment of a semiconductor device for use in a device according to the invention, while FIG. 11 is a diagrammatic plan view of a semiconductor device for use in another embodiment of the device according to the invention for focusing an astigmatic beam, while

Figure 1:
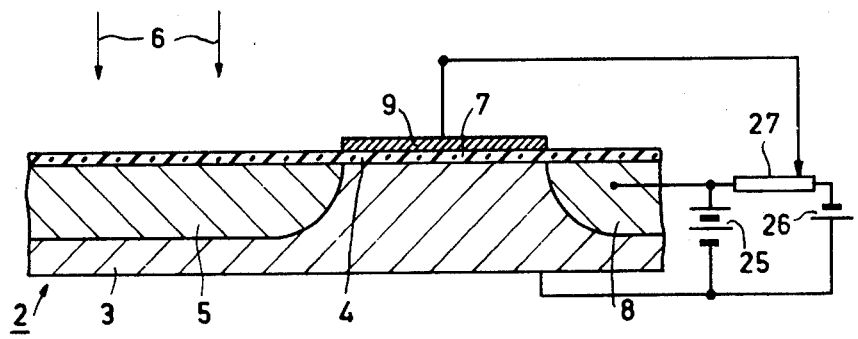
FIG. 1 is a diagrammatic cross-sectional view of an embodiment of a semiconductor body with reference to which the operation of a device according to the invention will be described in greater detail.

The Figs. are diagrammatic and not drawn to scale. For clarity the dimensions in the direction of thickness are highly exaggerated in the cross-sectional views. Semiconductor zones of the same conductivity type are shaded in the same direction, and corresponding parts in the various embodiments are generally referred to by the same reference numerals.

DESCRIPTION OF THE PREFERRED EMBODIMENTS

FIG. 1 is a cross-sectional view of a part of a semiconductor body 2 having a p-type substrate 3 in which $n^+$ type zones 5 and 8 are present at a surface 4. The surface 4 is covered with an insulating radiation-passing layer 7 on which an electrode 9 is provided. The voltage at said electrode can be controlled.

Figure 2:
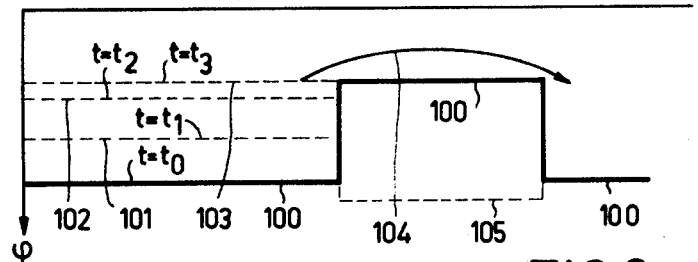
FIG. 2 shows diagrammatically a potential variation in said semiconductor body during operation.

FIG. 2 shows the associated surface potential variation. The potential variation is shown in a usual manner such that potential pits correspond to energy minima. These occur for the electrons in this example at the area of the $n^+$ regions. The solid line 100 in FIG. 2 corresponds to the potential variation along the surface of the semiconductor body at an instant $t_0$. This potential variation is also determined by a negative or comparatively low positive voltage at the electrode 9 so that the potential below said electrode is at a certain threshold value. The potential at the area of the region 8 is determined by a battery 25 of, for example, 10 Volts. If charge carriers are generated in the semiconductor body as a result of incident radiation (shown in FIG. 1 by means of arrows 6), electrons generated by said radiation move towards the potential pits at the area of the $n^+$ region 5. For simplicity it is assumed that at the area of the $n^+$ region 8 no radiation is incident and that electrons generated elsewhere in the semiconductor body do not move to the potential pit associated with region 8 or move there in a negligibly small quantity.

Since electrons generated in the semiconductor body as a result of incident radiation move towards the potential pit at the area of the $n^+$ region 5, charge is stored there. As a result of this the potential increases and the potential variation at the area of said pit at, for example, the instants $t_1$ and $t_2$, respectively, corresponds to the broken lines 101 and 102, respectively, in FIG. 2. If, as a result of incident radiation, more charge carriers are generated in the semiconductor body, the charge even further increases until at the instant $t=t_3$ a potential variation according to the broken line 103 is reached. This means that the potential at the area of the region 5 has become equal to the potential as adjusted below the electrode 9. Therefore, from the instant $t=t_3$ charge transport is possible from the $n^+$ region 5 to the potential pit at the area of the $n^+$ region 8. Newly generated electrons now cause an electron current from the $n^+$ region 5 to the $n^+$ region 8, shown diagrammatically in FIG. 2 by means of the arrow 104. The associated electric current can be detected by means of circuit elements not further shown in FIG. 1.

The duration between the instants $t=t_0$ and $t=t_3$ depends on the quantity of charge carriers generated by incident radiation and on the threshold value in the potential variation below the electrode 9. This threshold value can be adjusted by varying the voltage at the electrode 9 by means of a second battery 26 of, for example, 2 V, and a potentiometer 27.

At a fixed threshold value the duration between $t=t_0$ and $t=t_3$ therefore is a measure of the amount of generated charge carriers and hence of the quantity of radiation. The device according to the invention uses the fact that this duration depends on the quantity of incident radiation and the adjusted threshold value.

It is to be noted that when applying a comparatively high voltage to the electrode 9 a potential value prevails at the area of said electrode which is indicated in FIG. 2 by the broken line 105. As a result of this, electrons can be removed from the n+ region 5 via the n+ zone 8 to the positive terminal of the battery 25. When the voltage at the electrode 9 is then made low, the initial situation (potential variation according to the line 100) is again obtained.

Figure 3:
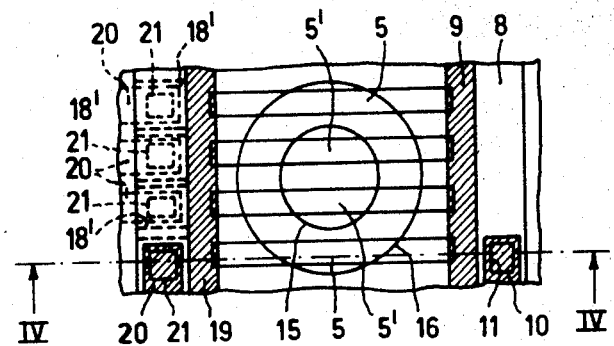
Figure 4:
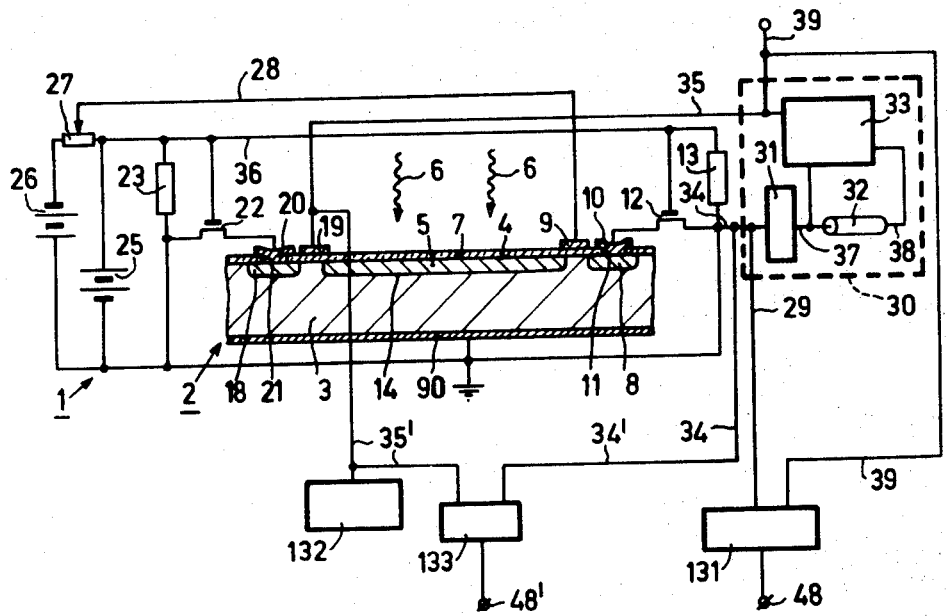
FIG. 4 is a diagrammatic cross-sectional view taken on the line IV—IV of FIG. 3.

FIGS. 3 and 4 show a semiconductor device 1 having a semiconductor body 2 which again comprises a p-type substrate 3, in this example of silicon. At a major surface 4, the substrate 3 comprises a radiation-sensitive element. This comprises several n-type zones 5 each forming a p-n junction 14 with the substrate 3. The surface 4, at least at the area of the sub-elements, is covered with a layer 7 of insulating material, for example of silicon oxide, which is pervious to incident radiation denoted by arrows 6. The semiconductor body 2 further comprises at its surface 4 an n+ drain zone 8 which is common to the sub-elements 5. Between the sub-elements and the drain zone a gate electrode 9 which is common to the sub-elements is provided on the insulating layer 7. By means of this electrode 9 a barrier can be created in the current path of the sub-elements 5 to the drain zone 8 in the underlying silicon. Dependent on the applied voltage, a barrier in the potential variation is provided along the surface 4 analogous to the barrier in the potential variation 100, as described with reference to FIGS. 1 and 2.

When radiation passes through, the current path having a barrier starts conveying current as described with reference to FIGS. 1 and 2. In order to detect this current in the device of FIGS. 3, 4, the drain zone 8 is connected, via a contact 10 which is provided in a contact window 11 in the insulating layer 7, to a circuit consisting of a MOS transistor 12 and a resistor 13. In this example the drain zone 8 together with the transistor 12 and the resistor 13 forms a detector which is common to the sub-elements. The substrate 3 is connected to ground via a metallization 90.

The device of FIGS. 3 and 4 moreover comprises a second drain zone 18 and an extra gate electrode 9 present on the insulating layer 7 between the sub-elements 5 and the drain zone 18. By means of this, the charge can be removed from the sub-elements when current is detected in the common drain zone 8. Instead of one drain zone 18, separated zones 18' with associated contact windows 21 and contacts 20 may be provided, as is denoted in FIG. 3 by means of broken lines. By connecting said mutually separated zones to transistors 22 and resistors 23, the amount of collected charge in each of the sub-elements which is a measure of the detected radiation incident per sub-element can be determined separately dependent on the speed and the velocity of the detector and associated circuit in as far as the threshold voltage determined by the voltage at the electrode 9 has not yet been reached in said sub-elements. The sub-elements which cause the detection current are, of course, filled entirely and comprise no significant information on the radiation distribution.

The semiconductor device of FIGS. 3 and 4 may be used in a device according to the invention, for example, to control the diameter of a radiation beam. A beam to be emitted, for example a laser beam of constant intensity, is directed partly on the radiation-sensitive sub-elements by optical auxiliary means, for example, a semi-permeable mirror. With a correct adjustment, for example, the region on the surface 4 is hit by the incident radiation which in FIG. 3 is indicated by means of the circle 15. In the case of a larger divergence of the beam, for example, the region indicated by the circle 16 will be hit.

It is to be noted that the present example is very diagrammatic, and is meant only to explain the operation of the device according to the invention. Actually, the dimensions of the beam and those of the radiation-sensitive sub-elements will generally be chosen to be so that with a correct adjustment many more than two-sub-elements are hit by the incident radiation.

Figure 5:
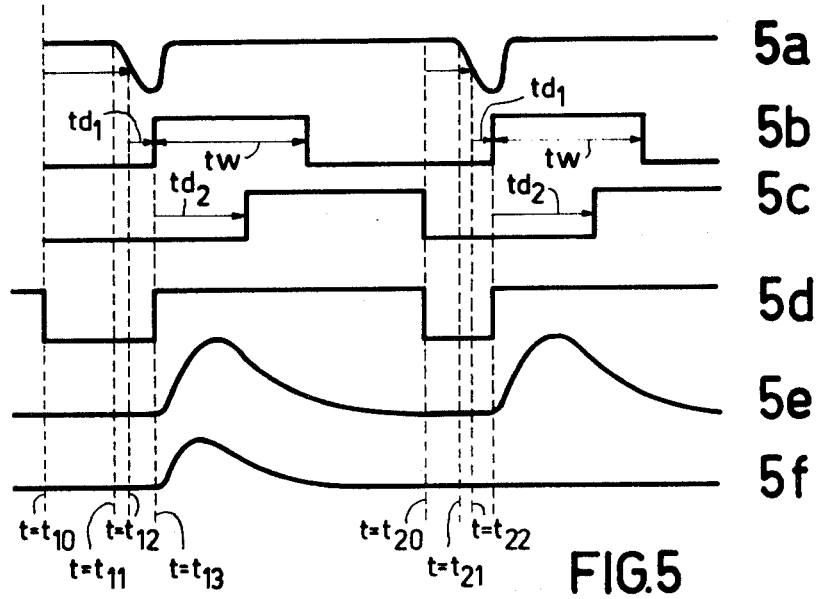
FIG. 5 shows diagrammatically a number of electrical signals to explain the operation of the device shown in FIGS. 3 and 4.

In order to explain the operation of the device shown in FIGS. 3 and 4, FIG. 5 shows a number of electric signals as they occur during operation in various points of the semiconductor device shown in FIGS. 3 and 4.

FIG. 5a shows diagrammatically the voltage variation occurring on the signal line 34;

FIG. 5b shows diagrammatically the voltage variation at the area of the point 37;

FIG. 5c shows diagrammatically the voltage variation at the area of the point 38;

FIG. 5d shows diagrammatically the voltage variation on the signal line 35;

while FIGS. 5e and 5f give a diagrammatic indication of the current to the drain regions 18'.

At the instant $t=t_{10}$ a signal line 35 is brought from a high voltage to a low voltage by a detection unit 30, the further operation of which will be described hereinafter. Via the electrode 19 a barrier for electron transport is provided therewith in the underlying semiconductor material. At the area of the n+ regions 5, 8, potential pits analogous to the potential pits described with reference to FIGS. 1 and 2 are present. The potential level in the n+ regions 5, 8 comes at a certain reference level via electrode 20. Since in this example a negative voltage is applied to the electrode 9, a barrier is present below said electrode which, however, is chosen to be lower than the barrier below the electrode 19. Dependent on the use, said barrier may be adjusted as the voltage at the electrode 9 is controlled. For this purpose, the electrode 9 is connected to the potentiometer 27 via the signal line 28. This potentiometer is provided between the positive terminal of the battery 25 and the negative terminal of the battery 26. If the dimensions of the beam diameter to be controlled is too large and the region indicated in FIG. 3 by the circle 16 is hit by the beam, the charge in the potential pits at the area of the sub-element 5' as a result of electrons generated by incident radiation 6 will increase such that after some time the associated potential variation gives rise to an electron current to the common drain zone 8. At the instant $t=t_{11}$, comparable to the instant $t=t_3$ in the description of FIG. 2, a current starts flowing to a common detector of which, in addition to the drain zone 8, the transistor 12 and the resistor 13 also form part. The transistor 12 and the resistor 13 are connected to a positive voltage line 36 in such manner that, as long as no current flows to the detector, the signal at the signal line 34 remains high. As soon as a current flows, said voltage decreases. The voltage at the signal line 34 forms an input signal for the detection unit 30. The variation of said voltage is shown in FIG. 5a. Inter alia a Schmitt trigger 31 is present in this example in the detection unit 30. At the instant $t=t_{12}$, the switching point of the Schmitt trigger 31 is reached and after a fixed time $t_{d1}$ determined by said Schmitt trigger, namely at the instant $t=t_{13}$, the output of the Schmitt trigger switches from low to high. This signal which occurs at the point 37 and the voltage variation of which is shown in FIG. 5b, is applied to a delay line 32. After a fixed time $t_{d2}$, determined by the delay line 32, the same signal appears at the output of the delay line 32 at the point 38 (indicated by the voltage variation in FIG. 5c). After a fixed time $t_w$, determined by the adjustment of the Schmitt-trigger, the signal at the point 37 then becomes low, succeeded after a period $t_{d2}$ by the signal on point 38. The signals of the points 37, 38 are applied to a logic circuit 33, in this example a not-or-circuit (NOR) the output of which is connected to the output signal line 35 of the detection unit 30. The voltage at the signal line 35 has been high from $t=t_{13}$, as shown in FIG. 5d, and again becomes low after a lapse of time determined by the pulse width $t_w$ dependent on the Schmitt trigger 31 and the duration $t_{d2}$ determined by the delay line 32. This high-low transition is comparable to the transition at the instant $t=t_{10}$. The time during which the voltage at the electrode 19 is high is sufficiently large to remove the charge which has been stored in the n+ regions 5 via the zone 18 and the circuit connected thereto.

When charge is removed via separate drain regions 18' and the currents generated thereby in the associated circuits are measured, a current as shown in FIG. 5e flows through the transistor connected to the region 5', while the smaller amount of charge, generated in the region 5, which is hit by a smaller amount of radiation gives rise to the current curve as shown in FIG. 5f.

When after readjusting the radiation beam the cycle just described is repeated from $t=t_{20}$, in which the same amount of radiation per unit of time is incident on the surface part bounded by the circle 15, the instant $t=t_{21}$ which is comparable to $t=t_3$ in the description of FIG. 3, will be reached much more rapidly. As a result of this Schmitt trigger 31 is again activated at the instant $t=t_{22}$ and a similar variation of signals as described above occurs. Because radiation is not incident on the sub-elements 5, the current in said sub-elements will be negligible as shown in FIG. 5f.

The beam diameter to be adjusted is therefore constant if upon repeated measurement a constant time duration is measured between the high-low transition of the output signal from the detection unit 30 to the signal line 35 and the overflow of charge from the potential pits at the area of the n+ regions 5 to the detector, or, for example, the switching of the Schmitt-trigger 31.

In order to determine this time difference various methods may be used.

For this purpose the output signal is applied to a first extra output line 39 while the detection unit has a second extra output line 29 on which the signal received via the signal line 34 appears. The second output line 29 may also display the signals on the points 37 or 38, if desired.

The time difference to be determined may be compared, for example, by means of the digital circuit 131, with a previously adjusted reference value; dependent on the result of this comparison the beam is narrowed or widened. For this purpose the circuit 131 supplies a signal via the signal line 48. It is also possible to cause the high-low transition on the signal line 35 to take place at a fixed frequency by means of the generator 132. The applied signal is compared, via the line 35' in the difference frequency meter 133, with the signal 34' of the detector. Dependent upon the result of this comparison the incident radiation is readjusted, if necessary. In this example the generator 132 and a part of the difference frequency meter 133 form the detection unit.

A significant advantage of the above-described device is that the beam to be controlled can be incident on any part of the surface of the radiation-sensitive element. In a device according to the invention this provides a large degree of freedom as regards the location of the semiconductor body relative to the radiation beam.

In a beam of which the beam cross-section viewed perpendicularly to the direction of radiation is constant, the radiation energy can be controlled in a similar manner because in this case the lapse of time between providing the potential pit and the detection signal is dependent on the energy of the incident radiation.

Figure 6:
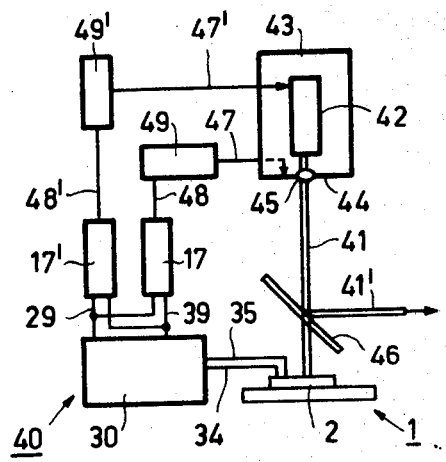
FIG. 6 shows diagrammatically an embodiment o the device according to the invention for controlling a radiation beam.

FIG. 6 shows diagrammatically a device in which both control possibilities are used. A laser beam 41 of constant radiation energy and diameter is emitted by the device 40 of FIG. 6. The laser beam 41 is generated by means of a laser 42 which is arranged in an envelope 43 or on a cooling block and, after passing through a wall 44 with controllable objective 45, is deflected by a semipermeable mirror 46. The part of the laser beam which is not deflected is incident on a semiconductor device 1 as described above having a semiconductor body 2 comprising a radiation-sensitive element. The semiconductor device is again connected, via signal wires 34, 35, to a detection unit which in this example can be operated in two different modes. In one mode the beam diameter of the emitted laser beam is controlled via the control line 47 in the above-described manner, while in the other mode the amount of radiation energy is controlled via the control line 47'.

For controlling the beam diameter, the signals originating from the input line 34 and the output line 35 of the detection unit 30 are applied to the control unit 17 via the outputs 29 and 39, respectively. Dependent on the signal on the lines 29, 39, a signal is applied by the control unit 17 via the signal line 48 to the adjusting unit 49 which adapts the lens position or the diaphragm of the controllable objective 45 via the control line 47. This occurs several times in succession in a manner similar to that described with reference to FIGS. 3, 4 until a constant time difference occurs between the high-low transitions of the lines 29, 39.

In order to control the radiation energy with constant beam diameter, the signals on the lines 29, 39 are applied to the control unit 17'. Dependent of these signals the control unit 17' applies a signal (via the line 48') to the adjusting unit 49' which can adapt the intensity of the laser beam 41, via the control line 47', for example, by varying the supply voltage of the laser 42. This is done again until a constant time difference occurs between the high-low transitions of the lines 29, 39.

By associating a second detection unit 30 with the device 40 in which either of the two devices can individually control one of the two quantities, it is possible to adjust said quantities in a non-intermitting manner.

In one of the above-mentioned examples it was stated how a diameter of a radiation beam can be measured and readjusted, respectively, by means of the device in accordance with the invention. By means of such a device a radiation beam can also be focused, for example, for adjusting a camera. For this purpose the time measured between providing a barrier (comparable to the high-low transition of the line 35 in FIG. 4, 5) and detecting the output signal can be measured in successive cycles. By adjusting, for example, an objective lens, the surface of the radiation-sensitive semiconductor element hit by the beam to be focused can be readjusted so that the measured duration corresponds to a previously-determined reference value. Charge generated in the sub-elements 5, 5' which is drained via removed drain zones 8' by means of detectors consisting of the drain zones 18', transistors 22 and the resistor 23, may also be used for this purpose. The signals originating from these detectors are used to readjust the adjustment in such manner that the number of sub-elements which gives off a signal as a result of generated charge is minimum.

Figure 7:
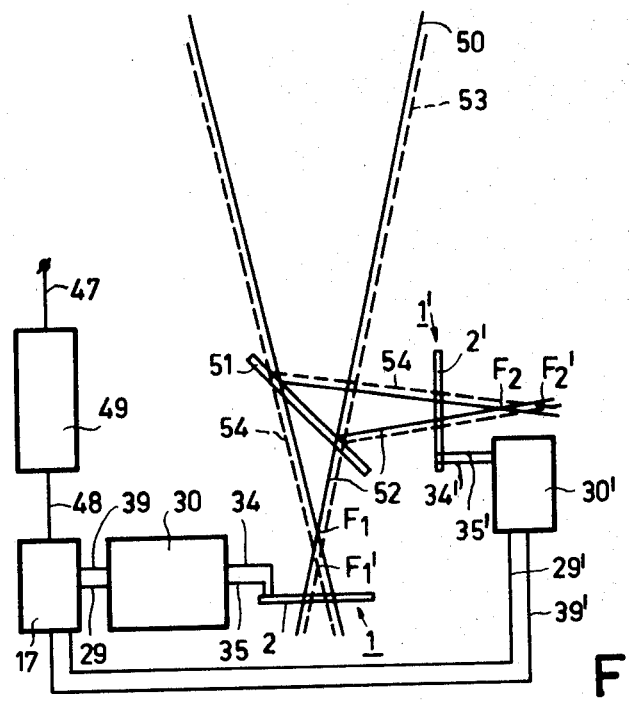
FIG. 7 shows diagrammatically an embodiment of the device according to the invention for focusing a radiation beam.

Another embodiment of the device in accordance with the invention for focusing a radiation beam, in particular a scanning beam as is used, for example, in video display disks (VLP) is shown in FIG. 7. The article "Video disk player optics" by G. Bouwhuis and J. J. M. Braat, in Applied Optics, Vol. 17, No. 13, pp. 1993–2000 shows diagrammatically in the figure on page 1994 a reading device for a display device. The objective 0 shown can be moved by means of a linear motor which forms part of a control circuit for the focusing. Said control circuit is controlled inter alia by control signals originating from a detector P'.

FIG. 7 shows how said control signals can be obtained by means of the device in accordance with the invention. The deflected part 50 of the beam reflected from a video disk or another optically-readable information carrier is incident on a semi-permeable mirror 51. The beam 50 is divided by the mirror 51 into two beams 52 of substantially equal intensity which impinge upon the two semiconductor devices 1 and 1'. With a correct focusing, denoted in FIG. 7 by the solid line beams 50, 52, substantially equal surface parts of the relevant semiconductor bodies 2, 2' are covered by the beams 52; the signals resulting herefrom appear substantially simultaneously on the signal lines 34, 34'. The case of an incorrect focusing is shown in FIG. 7, by the broken line incident beam 53 and split beams 54. In this case the beam 54 will cover a smaller part on the radiation-sensitive surface of one of the two semiconductor bodies, in this example the semiconductor body 2, than it covers on the radiation-sensitive surface of the semiconductor body 2'. As a result of this, the energy of the incident radiation on the semiconductor body 2 per unit of area is larger than on the semiconductor body 2'. As a result of this the associated detection signal occurs sooner in the device 1. Signals derived herefrom are again used to determine whether correction is necessary and, if so, how large said correction is to be and in what direction it is to take place. The control unit 17 to which the output signals of the detection units 30, 30' are applied can again be realized in various manners. For example, it may comprise a digital circuit in which the measured times are stored temporarily. Dependent on the difference measured between said times the focusing is readjusted via an adjusting unit 49 in such manner that the measured time difference between the detection signals of the signal lines 34 and 34' is substantially negligible. The frequencies of the separate detection signals can also be determined and applied to a frequency difference meter and the device may be readjusted so that the frequency difference is zero.

Figure 8:
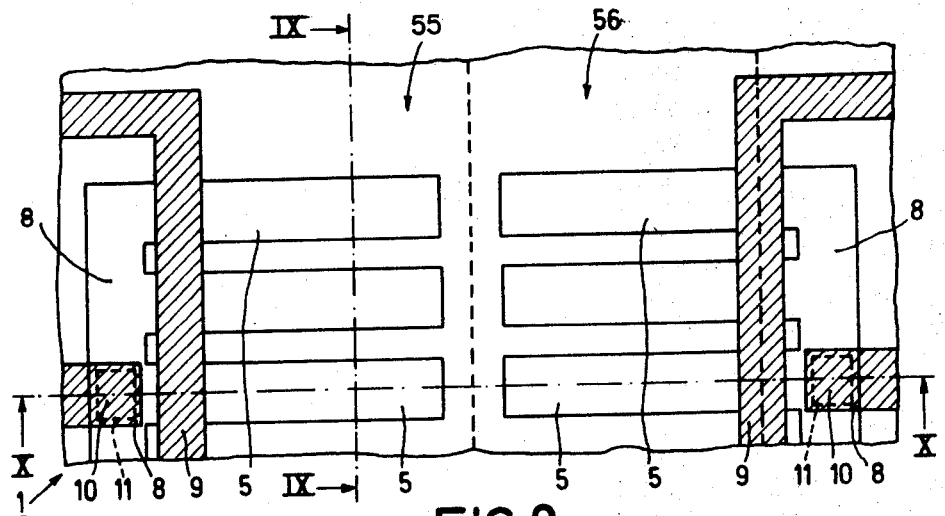
FIG. 8 is a diagrammatic plan view and FIGS. 9 and 10 are diagrammatic cross-sectional views taken on the line IX—IX and X—X of FIG. 8 of a semiconductor device for use in such a device.
Figure 9:
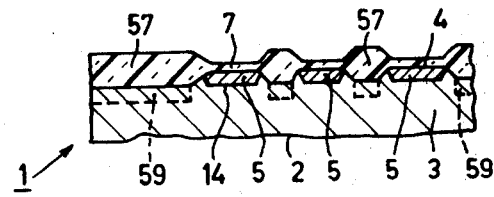
Figure 10:
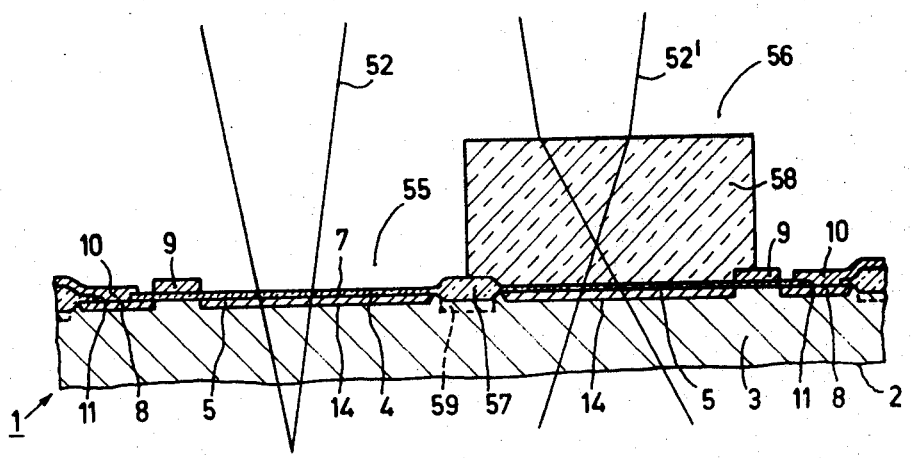

FIGS. 8 to 10 show another semiconductor device for use in a device in accordance with the invention. The two radiation-sensitive semiconductor devices 1, 1' of FIG. 7 are realized in one semiconductor body. It is in fact possible by means of auxiliary optical means to display the divided beams 52 from the FIG. 7 example on one plane. The device 1 comprises two radiation-sensitive devices 55, 56 in and on a semiconductor body 2. The construction of the radiation-sensitive devices is in principle equal to that of FIGS. 3 and 4. In this example, the gate electrodes 19 are omitted because only the detection instant is of importance for the present application. Adjusting the potential at the area of the sub-elements 5 after detection has taken place is possible by means of the electrode 9.

After detection, a high voltage is applied to the electrode 9 by means of an auxiliary circuit for a sufficiently long period of time to bring the potential in the sub-elements 5 again to an initial level, as described with reference to FIG. 2. The sub-elements are separated from each other by thick oxide 57 below which channel stopper regions 59 are present.

The path of rays of the beams 52 can be controlled with auxiliary optical means in such manner that they are incident in a substantially identical manner on the two radiation-sensitive sub-devices 55, 56. As described with reference to the FIG. 7 embodiment, the possibility of focusing is based inter alia on the fact that the focus of the two beams 52 is present in front of and behind the surface of the radiation-sensitive element respectively. The device shown in FIGS. 8 to 10 is covered for that purpose at the area of the radiation-sensitive sub-device 56 with a layer 58 of a radiation-passing material having a larger refractive index than the surrounding medium which may be, for example, air or a vacuum. As a result of this, the beam 52' converges more strongly within the layer 58 than in the surrounding medium. As a result of this stronger convergence, the focus of the beam 52' viewed in the direction of the radiation beam at the area of the sub-device 56 is present before the surface 4, while at the area of the sub-device 55 the focus of the beam 52 is present behind the surface 4. The layer 58 can be obtained by providing a glass plate at the area of the sub-device 56 which is connected by means of radiation-passing glue.

The device shown in FIGS. 8 to 10 can be manufactured in a simple manner. The starting material is a semiconductor body 2 having a substrate 3 of the n-type. The sunken oxide 57 is provided therein in known manner after the semiconductor body at the area of said oxide 57 to be provided is provided with acceptors for forming the buried channel stopper regions 59. The regions bounded laterally by thick oxide 57 are provided with a layer 7 of radiation-passing insulating material, for example, a thin layer of oxide. The gate electrode 9 is then provided hereon. An ion implantation is then carried out using said electrode 9 and the sunken oxide 57 as a mask, succeeded by a thermal treatment so that the n-type regions 5 and 8 are formed. The contact holes 11 and the metallization 10 are then provided in a generally known manner. A layer 58 of radiation-passing material of the desired thickness is finally provided at the area of the sub-device 56 over the radiation-sensitive sub-elements 5. If necessary the device is screened from incident radiation at the area of the regions 8, for example, by providing a metallization pattern.

Figure 11:
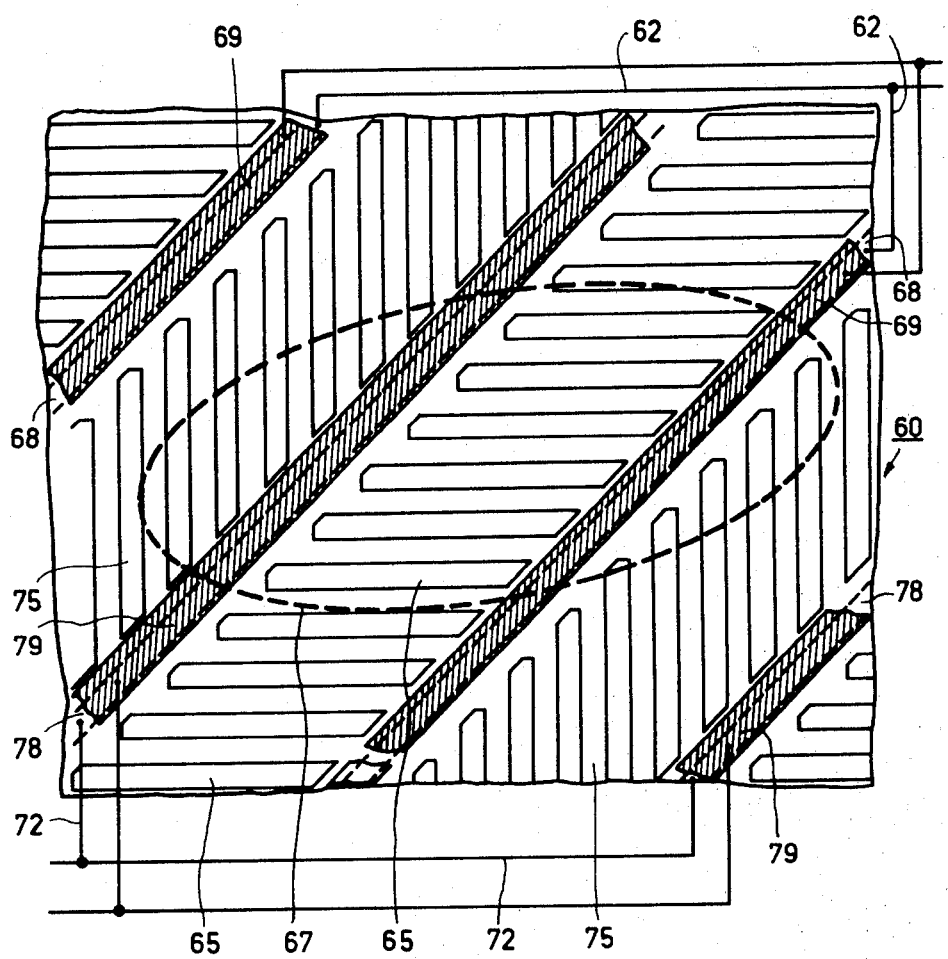

FIG. 11 is a plan view of a semiconductor device 60 for use in another construction of the device in accordance with the invention. In this case the sub-elements of two radiation-sensitive elements are interwoven for focusing an astigmatic beam. A device for focusing an astigmatic beam is described in German Offenlegungsschrift No. 2,501,124. An auxiliary beam derived from a beam to be focused is made astigmatic herein by means of a cylinder lens. When the auxiliary beam has not been focused it impinges on the surface according to a more or less elliptical pattern as is shown in FIG. 11 by means of the broken line 67. The large axis of the ellipse extends in one of two directions which are present perpendicularly to each other, dependent on the location of the semiconductor device in the beam (before or behind the point where the beam cross-section is minimum and the spot is substantially circular).

The semiconductor device of FIG. 11 comprises a number of horizontally shown radiation-sensitive sub-elements 65 and a number of vertically shown radiation-sensitive sub-elements 75. The horizontally shown sub-elements 65 combined in various groups have, per group, common drain zones 68, denoted in FIG. 11 by broken lines. As is further shown diagrammatically, the drain zones are connected to contact leads 62 which connect the drain zones via detectors to a detection unit in the same manner as described with reference to FIGS. 3 and 4. The barrier between the radiation-sensitive sub-elements 65 and the drain zones 68 can be adjusted by means of gate electrodes 69.

In the same manner, the various groups of vertically shown radiation-sensitive sub-elements 75 have common drain zones 78 connected to contact leads 72, the barriers in the current paths between the sub-elements and the drain zones being adjusted by means of gate electrodes 79.

In the FIG. 11 embodiment, the auxiliary beam impinges on the surface of the semiconductor body according to an elliptical pattern shown by means of a broken line 67. The major axis of the ellipse extends substantially parallel to the horizontally-shown sub-elements 65. This means that the sub-elements 65 in the case of incident radiation are hit by said radiation over a comparatively larger area than the vertically shown sub-elements 75. A drain zone 68 coupled to the horizontal sub-elements will hence be the first to activate a detection unit via the contact line 62 and the remaining parts of the detector.

For such a device it is not strictly necessary for the sub-elements 65, 75 to extend transversely to each other. Also, when they are provided relative to each other at an acute or an obtuse angle, the amount of charge generated as a result of radiation in one of the two mutually interwoven radiation-sensitive elements will be the first to give rise to a detection signal if the surface is hit according to an elliptical pattern.

In a similar manner to that described with reference to FIG. 7, the signals received by the detection unit and belonging to the horizontally and vertically shown sub-elements, respectively, may be used for adjusting a lens position in such manner that the response of the two radiation-sensitive elements takes place substantially simultaneously. Herewith an optimum focusing is obtained. This is the case with an auxiliary beam which impinges on the surface according to a substantially circular pattern. In that case the amount of charge generated per unit of time as a result of incident radiation in the sub-elements 65 and 75 is substantially equal.

Figure 12:
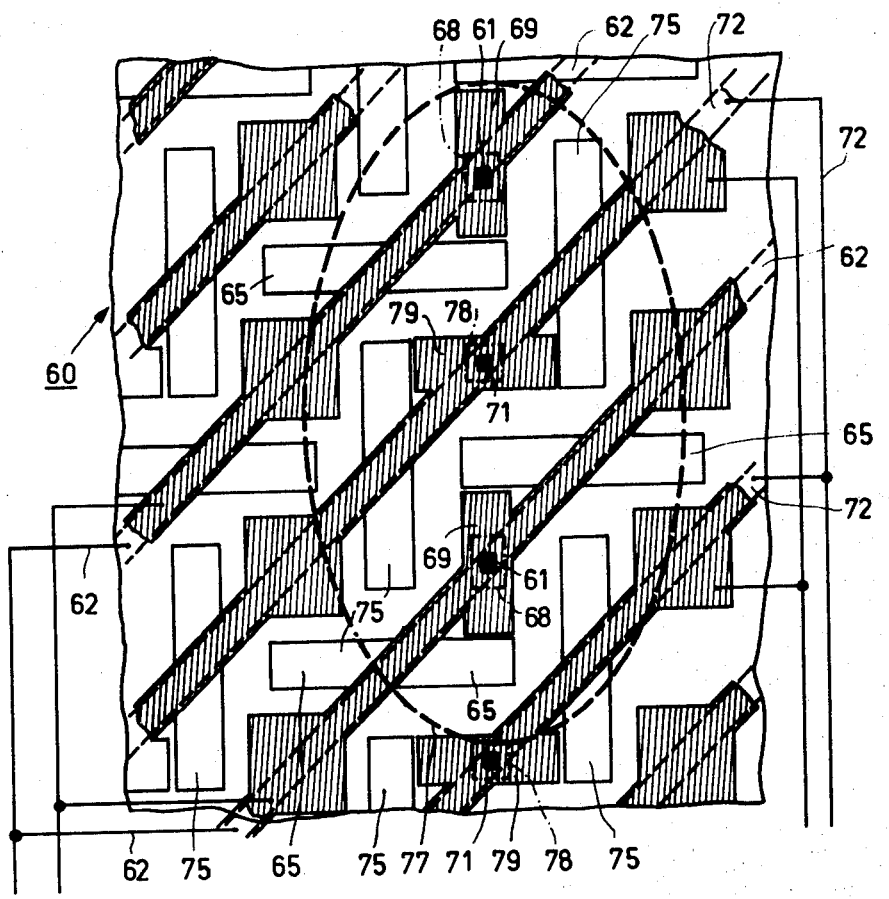
FIG. 12 shows diagrammatically a modified embodiment thereof.

The same is possible with the semiconductor device shown in the plan view of FIG. 12. In this case also a number of radiation-sensitive sub-elements 65, 75 provided at right angles with respect to each other are present at the surface of the semiconductor body, in which two horizontally-shown sub-elements 65 always belong to a common drain zone 68 present between the sub-elements 65. In the same manner, two vertically shown sub-elements 75 always belong to a common drain zone 78 present between the sub-elements 75. The drain zones 68, 78 belonging to the horizontally and vertically shown sub-elements, respectively, are interconnected by means of contact leads 62, 72, which in FIG. 12 are shown in broken lines. The contact leads 62, 72 are connected to drain zones 68, 78 via contact holes 61, 71 and are shown in FIG. 12 by dot-and-dash lines and are always connected to two sub-elements 65, 75 via current paths comprising barriers. For example, as a result of charge generated in the sub-elements 65 shown horizontally in FIG. 12 as a result of incident radiation, the potential at the area of the sub-elements 65 will reach a value which is equal to the value which is adjusted by means of the gate electrode 69 between the sub-elements 65 and the drain zones. As a result of this, when radiation continues, an electron current will flow between the sub-elements 65 and the drain zone 68. In the same manner an electron current can start flowing between the sub-elements 75 and the drain zone 78 when the potential in the vertically shown sub-elements 75 as a result of charge generated by radiation exceeds the potential which is adjusted between the sub-elements 75 and the drain zone 78 by means of the gate electrode 79. The gate electrodes 69, 79 are separated from the underlying contact leads 62, 72 by means of an insulating layer, while the metallization pattern of said electrodes does not only extend between the sub-elements 65, 75 and the associated drain regions 68, 78, but simultaneously protects the semiconductor body from incident radiation in areas outside the sub-elements. This measure prevents charge from being generated as a result of incident radiation in undesired areas, namely at the area of the drain regions 68, 78. In the FIG. 11 device the metallization of the gate electrodes 69, 79 also fulfils such a function since it fully covers the drain zones 68, 78.

In the FIG. 12 embodiment, the incident beam impinges on the surface of the semiconductor device 60 according to the ellipse 77, the major axis of which extends substantially parallel to the vertically-shown sub-elements. The potential in the sub-elements 75 will as a result of charge generated by incident radiation first reach a value equal to that below the gate electrode 79. As a result of this, first of all a detector is activated via the contact lead 72 and then a detection unit is activated; the correct focusing can then be adjusted again by means of output signals from this unit.

Figure 13:
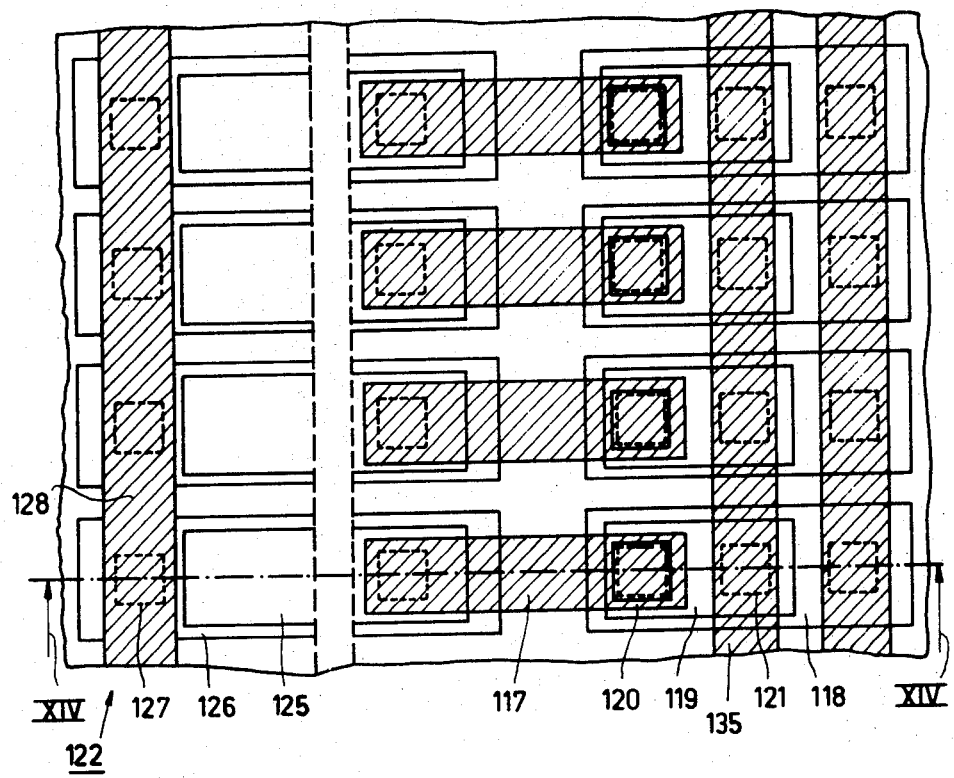
FIG. 13 is a diagrammatic plan view and FIG. 14 is a diagrammatic cross-sectional view taken on the line XIV—XIV of FIG. 13 of a semiconductor device for use in another embodiment of the device according to the invention.
Figure 14:
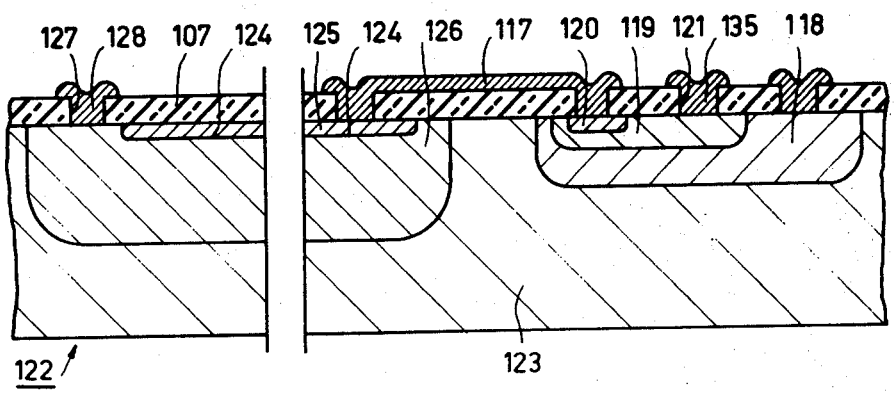
Figure 15:
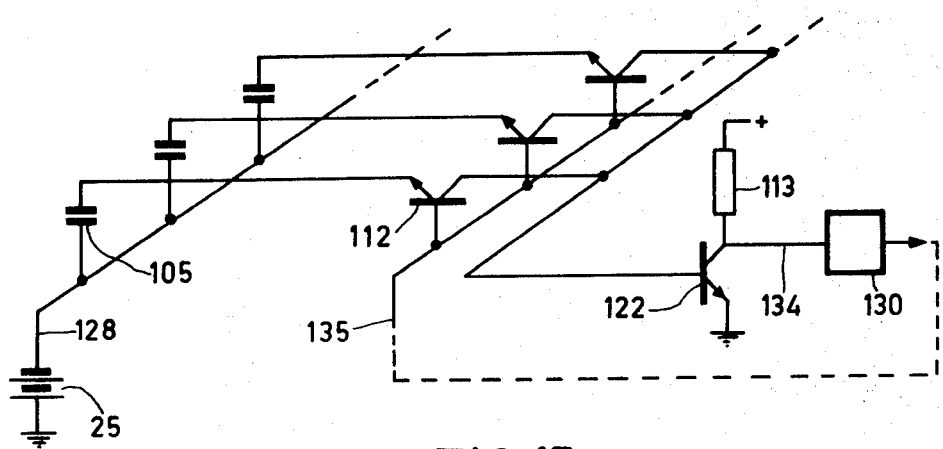
FIG. 15 shows diagrammatically the electric equivalent circuit diagram hereof.

In the FIG. 13 semiconductor device 122, the radiation-sensitive sub-elements are formed by p-n junctions 124 between n-regions 125 and p-regions 126 formed in a high-ohmic p-type substrate 123. During operation, the p-n junctions are reversely biased. They show a certain capacity denoted in FIG. 15 by the capacitors 105.

At its surface the semiconductor body 122 is covered with a radiation-passing insulating layer 107. Present on this layer is a connection track 128 which is common to a number of p-type zones 125 and which connects the p-type regions 126 via contact holes 127 to the negative terminal of a battery 25 having a voltage of 2 volts. The n-type regions 125 are each connected via a metal track 117 to the emitters of npn transistors 112 having collector regions 118, base regions 119 and emitter regions 120. The base regions 119 are connected via contact holes 121 to a common control line 135 on which in the operating condition a control signal from a detection unit 130 appears which is obtained in a manner similar to that in the example of FIG. 3 to 5.

By means of the control lines the bases of the transistors 112 are brought to a given reference voltage, for example at ground potential. Via the emitters 120 the n-regions 125 obtain a potential of approximately −0.7 V. The p-type regions 126 are connected to the negative plate of the battery 25. As a result of this the p-n junction 124 is cut off. The cut-off voltage is approximately 1.3 volts.

When in the absence of incident radiation on the sub-elements formed by the capacitors 105 (the p-n junctions 124), the voltage of the bases is brought to approximately −1 volt by means of the control line 135, the n-zones 125 and hence also the emitter regions 120 keep a voltage of approximately −0.7 volt. The base-emitter junctions of the transistors 112 are then cut off.

In the presence of incident radiation, charge carriers are generated on either side of the p-n junctions 124. Since the p-n junctions are cut off, electric fields prevail over said junctions which are directed from the n-regions 125 to the p-regions 126. Holes generated in a radiation-sensitive sub-element are drained under the influence of the prevailing electric field via the p-region 126 and the connection track 128 to the negative plate of the battery 25 or recombine in the p-region 126 with electrons provided by the battery 25.

The electrons generated as a result of incident radiation are drained to the n-zones 125 by the same electric field. As a result of this the amount of negative charge in said n-zones increases and the potential in one of the sub-elements drops to, for example, −1.7 volts. The forward voltage across the emitter-base junction of the associated transistor 112 then is sufficient to drain the extra charge which is generated by incident radiation as an electron current through the transistor to the collector region 118. As a result of this the transistor 112 becomes conductive. The collector regions 118 are connected to the base of transistor 122 which together with the connector lead 131 and the resistor 113 form a detector which is common to a number of sub-elements 105. As soon as a sufficient current passage is registered in one or more of the transistors 112, said detector applies a signal to the detection unit 130 via the lead 134.

Figure 16:
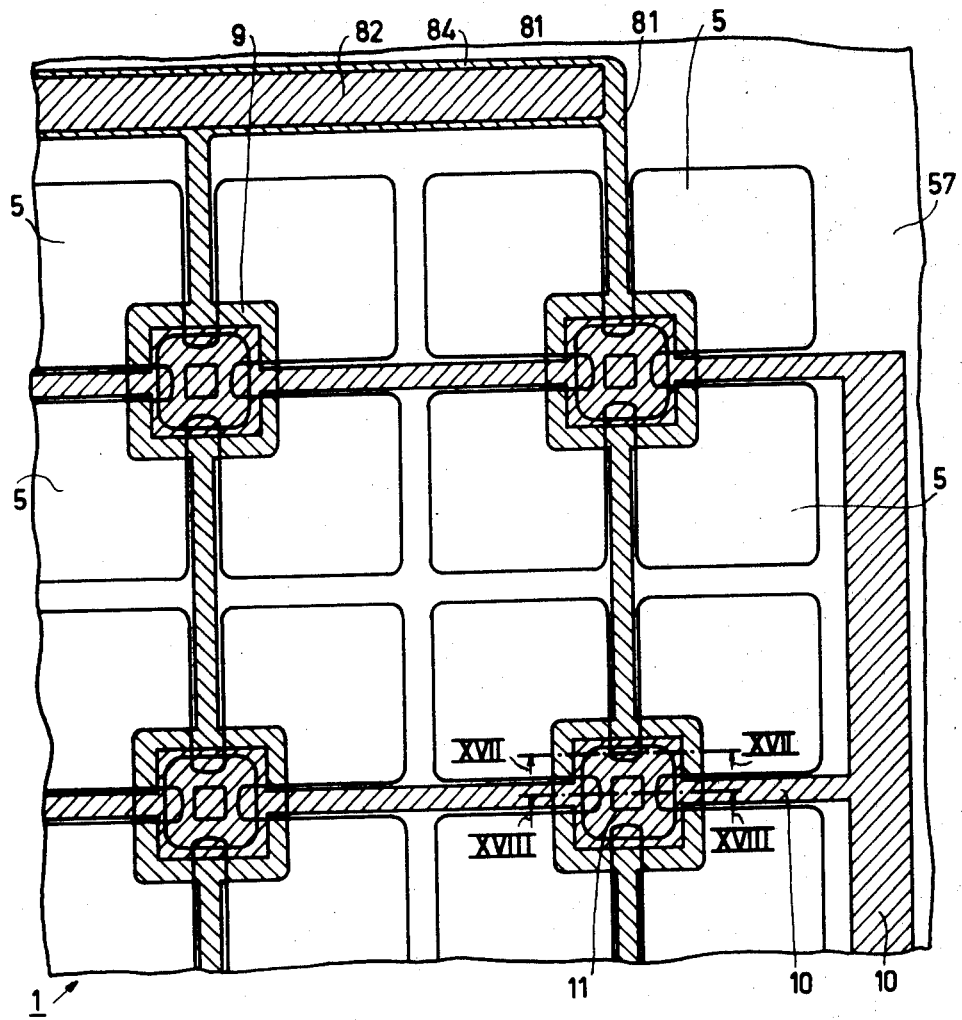
FIG. 16 is a diagrammatic plan view and FIGS. 17 and 18 are diagrammatic cross-sectional views taken on the line XVII—XVII and XVIII—XVIII of FIG. 16 of a modified embodiment of the semiconductor device which may be used in the device according to the invention.
Figure 17:
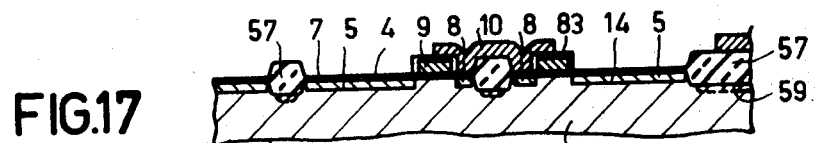
Figure 18:
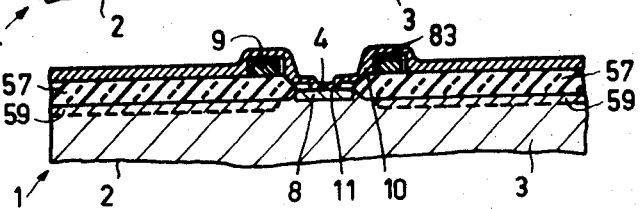

Of course the invention is not restricted to the above examples, FIGS. 16, 17 and 18, for example, show a semiconductor device 1 for use in an embodiment in which four radiation-sensitive sub-elements are grouped around a common drain zone 8. Groups of four sub-elements and the associated drain zone are provided in a larger matrix-shaped assembly in the semiconductor body 2. The gate electrodes 9 in this example form part of a combshaped pattern 81 of polycrystalline silicon in which at the area of the drain zones 8 the actual gate electrodes, viewed in plan view, are approximately annular. Within each of these rings at the area of the drain zones 8, contact holes 11 are present which in turn are mutually interconnected by means of a comb-shaped contact 10, the teeth of which are present transverse to those of the comb-shaped polycrystalline silicon pattern 81. For purposes of making a good contact, the polycrystalline silicon has an extra contacting layer 82, of for example, aluminum. For this purpose a contact window 84 is provided in the oxide layer 83 which in other places separates the polycrystalline silicon 9, 81 from the metallization pattern 10.

Devices having a semiconductor device as shown in FIGS. 16 to 18 are particularly suitable for the control of beams which impinge on the surface according to a substantially circular pattern, or for determining an area. as the area of the sub-element is made smaller, such a device becomes faster.

Figure 19:
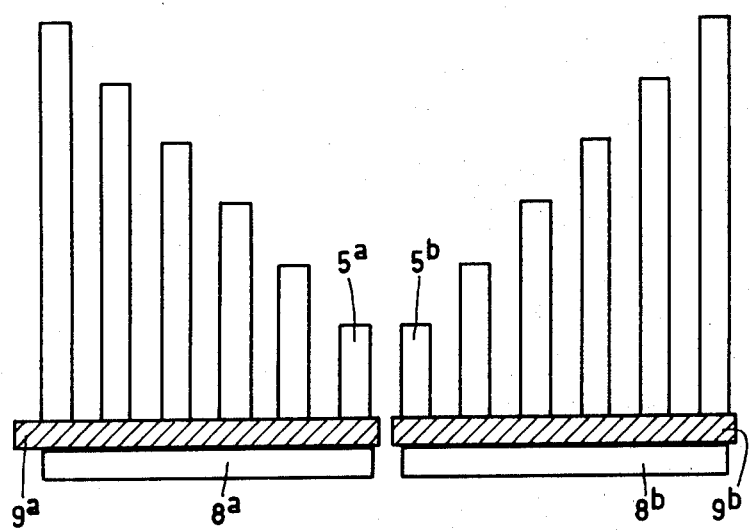
FIG. 19 is a diagrammatic plan view of another modified embodiment.

The threshold value of the potential in the current path need not always be the same for all sub-elements. For example, this can be achieved by manufacturing the common gate electrode 5 from resistance material, for example polycrystalline silicon, and providing a voltage drop across said electrode. In this manner weight factors may be allotted to the sub-elements. This is realized differently in the device of FIG. 19. In this case two radiation-sensitive elements of the kind described with reference to FIGS. 3 to 5 are realized having sub-elements of different sizes.

With a correct adjustment of the beam on the interface of the two elements, these will give off a signal substantially simultaneously. When the beam is incident on the surface eccentrically, one of the two elements, namely that one on which the beam is substantially incident, will give off a signal first, the duration being a measure of the value of the displacement of the beam.

Nor need the detector always comprise a transistor and a resistor, but within the scope of the invention many variations are possible for detecting a current between one or more sub-elements 5 and the drain zone 8. The semiconductor device of FIGS. 8 to 10 need not be covered with a plate only at the area of the sensitive element 52'. The semiconductor body may also be covered with a glass plate which at the area of the radiation-sensitive element 52' is thicker than at the area of the radiation-sensitive element 52.

What is claimed is:

1. A device for detecting radiation comprising a semiconductor device having a semiconductor body with a major surface and at least one radiation-sensitive element at said surface which can be exposed to radiation to be detected, said radiation-sensitive element comprising sub-elements for converting radiation to be detected into generated charge, characterized in that the sub-elements are suitable for storing the generated charge and are each connected, via a current path comprising an electrically-controllable barrier, to a detector which is common to at least a plurality of sub-elements, the common detector receiving a signal when the amount of generated charge stored in at least one of the sub-elements exceeds a threshold value dependent on the barrier level.

2. A device as claimed in claim 1, characterized in that the device has an optical system for causing the convergence of the radiation to be detected to an adjusting plane, in which at least a part of the radiation can be deflected towards at least a part of the surface of the radiation-sensitive element.

3. A device as claimed in claim 2 characterized in that the optical system can divide an auxiliary beam derived from the radiation beam into two converging beams each impinging on a semiconductor body having at its surface at least one radiation-sensitive element in which, viewed in the direction of the radiation, the surface of the semiconductor body having a first radiation-sensitive element is present before the focus of one converging beam and the surface of the semiconductor body having a second radiation-sensitive element is present behind the focus of the other converging beam.

4. A device as claimed in claim 3, characterized in that the two converging beams can impinge upon one semiconductor body which at its surface has at least two radiation-sensitive semiconductor elements in which, viewed in the direction of the radiation, the surface of the semiconductor body at the area of the first radiation-sensitive semiconductor element is present before the focus of one converging beam and the surface of the semiconductor body at the area of the second radiation-sensitive semiconductor element is covered with a layer of radiation-passing material having a refractive index exceeding that of the medium in which the semiconductor body is present and such a thickness that the focus of the other beam is present in the layer of radiation-passing material as a result of the stronger convergence in said radiation-passing material.

5. A device as claimed in claim 2 for adjusting an astigmatic beam, characterized in that the semiconductor body at its surface comprises at least one pair of radiation-sensitive elements having parallel stripe-shaped sub-elements in which the sub-elements of the two radiation-sensitive elements are provided at an angle relative to each other within one surface region.

6. A device as claimed in claim 5, characterized in that the sub-elements of the two radiation-sensitive elements are transverse to each other.

7. A device as claimed in claims 3, 4, 5 or 6, characterized in that the device comprises detection means for providing a first signal to bring the sub-elements into an initial condition suitable for storing charge generated as a result of incident radiation and which can provide a signal originating from the detector to a control unit, which control unit can provide a control signal for the adjustment of the radiation beam.

8. A device as claimed in claim 1 or 2, characterized in that the threshold value for the amount of charge generated as a result of incident radiation is adjustable.

9. A device as claimed in any of the claim 1 or 2, characterized in that the semiconductor device has a reset connection for adjusting the potential in the sub-elements at a reference value.

10. A device as claimed in claim 1 or 2, characterized in that the semiconductor device at its surface comprises in the current path between a plurality of sub-elements and the common detector a plurality of field effect transistors, the source zones of which are each connected to a sub-element and the drain zones of which are connected to the detector, the field effect transistors having a common gate connection for adjusting the barrier.

11. A device as claimed in claim 10, characterized in that the semiconductor body comprises a surface region of a first conductivity type having a number of first surface zones of a second conductivity type opposite to the first which form the sub-elements of the radiation sensitive elements and the source zones of the field effect transistors and at least one second surface zone which forms a common drain zone of the field effect transistors, while the surface between the first surface zones and the second surface zone is covered with a layer of insulating material on which a gate electrode common to the field effect transistors is present.

12. A device as claimed in claim 11, characterized in that the semiconductor body at its surface comprises at least one pair of radiation-sensitive elements having parallel stripe-shaped sub-elements in which the sub-elements of the two radiation-sensitive elements are provided at an angle relative to each other within one surface region, and in that the first surface zones form sub-elements of one radiation-sensitive element and are provided between the sub-elements of the other radiation-sensitive element in such manner that the surface zones, viewed in plan view, are strip-shaped and parallel, the parallel strip-shaped surface zones of one radiation-sensitive element enclosing an angle with respect to the parallel strip-shaped surface zones of the other radiation-sensitive element.

13. A device as claimed in claim 10, characterized in that the gate electrode comprises a layer of resistance material.

14. A device as claimed in claim 10, characterized in that the sub-element has a p-n junction in the semiconductor body which entirely encloses this zone.

15. A device as claimed in claim 1 or 2, characterized in that the semiconductor body at its surface in the current paths between the sub-elements and the detector comprises a plurality of bipolar transistors, the emitters of which are each connected to a sub-element and the collectors of which are connected to the detector, the transistors having a common base connection.

16. A semiconductor device for use in a device as claimed in claim 15, comprising a semiconductor body having a major surface and at least one radiation-sensitive element at said surface provided with sub-elements for converting radiation into charge, characterized in that the sub-elements are suitable for storing generated charge and each sub-element is connected to the emitter of a transistor realized at the surface of the semiconductor body, in which at least a plurality of transistors are provided with interconnected bases for adjusting a barrier in the current path between the collectors and emitters of the transistors, the collectors being interconnected by means of a common contact lead which forms part of a detector.

17. A semiconductor device as claimed in claim 16, characterized in that the transistors are provided with interconnected bases of a common collector region.

18. A semiconductor device as claimed in claim 16, characterized in that the semiconductor body comprises at least two radiation-sensitive elements, the semiconductor surface at least at the area of one of the radiation-sensitive elements being covered with a layer of radiation-passing material.

19. A device as claimed in claim 1 for controlling the area of the part of a surface hit by a radiation beam having a constant amount of radiation energy, characterized in that the device has detection means for providing a first signal to bring the sub-elements into an initial condition suitable for storing charge carriers generated by incident radiation and which can apply a detection signal originating from the detector or a signal derived therefrom to means for controlling the form of the radiation beam via an adjusting unit in such manner that the time difference between the first signal and the detection signal is substantially constant.

20. A device as claimed in claim 1 for controlling the radiation energy of a radiation beam which is incident on a surface according to a pattern of constant area, characterized in that the device comprises detection means for providing a first signal to bring the sub-elements into an initial condition suitable for storing charge carriers generated by incident radiation and which can provide a detection signal originating from the detector to means for controlling the radiation energy of the radiation beam via an adjusting means in such manner that the time difference between the first signal and the detection signal is substantially constant.

21. A semiconductor device for use in a device as claimed in claim 1 having a semiconductor body with a major surface and at least one radiation-sensitive element of said surfaces having sub-elements for converting radiation into charge, characterized in that the sub-elements are suitable for storing generated charge and each sub-element is connected to a source zone of a field effect transistor realized at the surface of the semiconductor body, in which at least a plurality of field effect transistors are provided with interconnected gate electrodes for adjusting a common barrier between the source zones and drain zones of the field effect transistors, the drain zones being interconnected and having a common connection which forms part of a detector.

22. A semiconductor device as claimed in claim 21, characterized in that field effect transistors having a common gate electrode are provided with a common drain zone.

23. A semiconductor device as claimed in claim 21 or 22, characterized in that the semiconductor body at its surface has a surface region of a first conductivity type provided with a plurality of first surface zones of a second conductivity type opposite to the first, separated from each other and simultaneously forming sub-elements of the radiation-sensitive element and source zones of the field effect transistors, and at least one second surface zone of the second conductivity type which forms the drain zone of at least a plurality of field effect transistors while the surface of the semiconductor body between the first surface zone and the second surface zone is provided with a dielectric layer on which a gate electrode which is common to the field effect transistors is provided.

24. A semiconductor device as claimed in claim 23, characterized in that the gate electrode comprises resistive material.

* * * * *